United States Patent
Duboc et al.

(10) Patent No.: US 6,425,116 B1
(45) Date of Patent: Jul. 23, 2002

(54) AUTOMATED DESIGN OF DIGITAL SIGNAL PROCESSING INTEGRATED CIRCUIT

(75) Inventors: Jean Francois Duboc, Saint Laurent du Var; Sandra Barea, Valbonne; Eric Bernasconi, Antibes, all of (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/539,089

(22) Filed: Mar. 30, 2000

(51) Int. Cl.[7] .......................... G06F 17/50; G06F 15/76
(52) U.S. Cl. .............................. 716/18; 716/17; 712/35
(58) Field of Search ..................... 716/1–21; 712/35–37

(56) References Cited

U.S. PATENT DOCUMENTS

| | | | | |
|---|---|---|---|---|
| 5,802,382 A | * | 9/1998 | Greenberger et al. | 712/36 |
| 6,041,400 A | * | 3/2000 | Ozcelik et al. | 712/35 |
| 6,092,179 A | * | 7/2000 | Greenberger et al. | 712/35 |
| 6,237,132 B1 | * | 5/2001 | Dean et al. | 716/18 |

FOREIGN PATENT DOCUMENTS

| WO | WO 98/37475 | 8/1998 | G06F/17/50 |
|---|---|---|---|

OTHER PUBLICATIONS

Lee et al. ("The Motorola 16–bit DSP ASIC core", 1990 International Conference on Acoustics, Speech, and Signal Processing, vol. 2, Apr. 3, 1990, pp. 973–976).*

Michalina ("Application specific DSP at SGS Thomson", IEEE International Symposium on Circuits and Systems, vol. 1, May 8, 1989, pp. 627–630).*

Ko et al. ("DSP core with parallel module testability", Proceedings of Second Annual IEEE ASIC Seminar and Exhibit, Sep. 25, 1989, pp. P6–3/1–5).*

Lin et al. ("Embedded architecture co–synthesis and system integration", Proceedings of Fourth International Workshop on Hardware/Software Co–Design, Mar. 18, 1996, pp. 2–9).*

De Man, H. et al., "Cathedral–II — a computer–aided synthesis system for digital signal processing VLSI systems", *Computer–Aided Engineering Journal*, Document No. XP002166789, (Apr. 1988), pp. 55–59.

Ruiz, P.L. et al., "Design and prototyping of DSP custom circuits based on a library of arithmetic components", New Orleans, Nov. 9–14, 1997, New York, NY: IEEE Service Center (Nov. 11, 1997) XP00089466, ISBN: 0–7803–3933–9, pp. 191–196.

*HDL Integrator*, Product Brochure, VLSI Technology, Inc., (Mar. 1998), 4 pages.

* cited by examiner

Primary Examiner—Matthew Smith
Assistant Examiner—Phallaka Kik
(74) Attorney, Agent, or Firm—Peter Zawilski (57) ABSTRACT

An apparatus, program product and method are provided for use in automating the design of a custom DSP integrated circuit from a preexisting DSP core block and one or more additional circuit blocks interfaced with the DSP core block. An input display is displayed to a user, and is utilized to receive user input from the user for use in automatically building a custom DSP integrated circuit. The input display includes at least one selection input component for use in selecting at least one optional circuit block for inclusion in the custom DSP integrated circuit, and at least one configuration input component for use in customizing a customizable circuit block to be included in the custom DSP integrated circuit. The user input received from the user through the input display selects the optional circuit block and customizes the customizable circuit block. Based upon such input, a custom DSP integrated circuit is automatically built by generating a custom circuit block from the customizable circuit block and interfacing the preexisting DSP core block with the optional circuit block and the custom circuit block.

21 Claims, 5 Drawing Sheets

| DSP BUILDER TEMPLATE | | | | | |
|---|---|---|---|---|---|
| DATA MEMORY SPACE: Y SPACE SIZE: | ● 2K | ○ 4K | ○ 8K | ○ 16K | — 172 |

| Y DATA SPACE: 176   174 | | |
|---|---|---|
| DATA Y ROM START ADDRESS: | | 0xC000 to 0xFFFF |
| DATA Y ROM TOTAL SIZE: | 0 TO 16384 | 178 |
| Y ROM BLOCKS: | EDIT / DELETE / NEW | |
| DATA Y RAM START ADDRESS: | 182 | 0xC000 to 0xFFFF |
| DATA Y RAM TOTAL SIZE: | 0 TO 16384   180 | 184 |
| Y RAM BLOCKS: | EDIT / DELETE / NEW | |

| X DATA SPACE: 188   186 | | |
|---|---|---|
| DATA X ROM START ADDRESS: | | 0x0000 to 0xF7FF |
| DATA X ROM TOTAL SIZE: | 0 TO 63487 | 190 |
| X ROM BLOCKS: | EDIT / DELETE / NEW | |
| DATA X RAM START ADDRESS: | 194 | 0x0000 to 0xF7FF |
| DATA X RAM TOTAL SIZE: | 0 TO 63487   192 | 196 |
| X RAM BLOCKS: | EDIT / DELETE / NEW | |

| PROGRAM SPACE:200   198 | | |
|---|---|---|
| PROGRAM ROM START ADDRESS: | | 0x0000 to 0xFFFF |
| PROGRAM ROM TOTAL SIZE: | 512 TO 65536 | 202 |
| PROGRAM ROM BLOCKS: | EDIT / DELETE / NEW | |
| PROGRAM RAM START ADDRESS: | 206 | 0x0000 to 0xFFFF |
| PROGRAM RAM TOTAL SIZE: | 1K TO 65536   204 | 208 |
| PROGRAM RAM BLOCKS: | EDIT / DELETE / NEW | |

| MEMORY BUILT IN SELF TEST TYPE: | ● SOFTWARE | ○ HARDWARE — 210 |
|---|---|---|

| PATCH: 212 | |
|---|---|
| HOW MANY PROGRAM PATCHES? | 0 TO 8 |

| COPROCESSORS: | | |
|---|---|---|
| COPROCESSOR INTERFACE: | ● NO ○ YES | — 214 |
| OUTPUT P REGISTER: | ● NO ○ YES | — 216 |

| VPB SPACE: | 218 |
|---|---|
| VPB BRIDGE DEFINITION: | EDIT / DELETE / NEW |

| DMA: | |
|---|---|
| DMA OPTION: | ● NO ○ YES — 220   222 |

| COMPONENT NAME/OUTPUT FILE (NO EXT.): | 224 | 226 |
|---|---|---|
| COMPILE | | CLOSE |

FIG. 7

AUTOMATED DESIGN OF DIGITAL SIGNAL PROCESSING INTEGRATED CIRCUIT

FIELD OF THE INVENTION

The invention is generally related to the design of integrated circuits. More specifically, the invention is generally related to the design of integrated circuits based around digital signal processors (DSP's) from modular reusable components.

BACKGROUND OF THE INVENTION

As semiconductor fabrication technology advances, designers of integrated circuits are able to integrate more and more functions into a single integrated circuit device, or chip. As such, electronic designs that once required several integrated circuits electrically coupled to one another on a circuit board or module may now be integrated into a single integrated circuit, thereby increasing performance and reducing cost.

One function that has been migrated from discrete circuits to integrated circuits is digital signal processing, which is generally the application of mathematical operations to digitally represented signals. Digital signal processing is utilized in a number of applications, such as to implement filters for audio and/or video signals, to decode information from communications signals such as in wireless or other cellular networks, etc.

As integrated circuit designs continue to increase in performance and complexity, the design of such circuits becomes increasingly complex and time consuming. Integrated circuits are often made up of hundreds of thousands or even millions of individual transistors. As a consequence, the ability to automate the design process and thereby shift the burden for designing integrated circuits from man to machine is a constant need in the art.

To facilitate the design of integrated circuits, software programs, also referred to as "tools", have been developed to permit a developer to define an integrated circuit design at a relatively higher conceptual level, and then have operations such as synthesizing the physical layout of the integrated circuit design, testing the integrating circuit design, etc., performed automatically by the tool. Integrated circuit design has paralleled many of the concepts embodied in object-oriented software design as well, where lower-level functionalities for a design are compartmentalized into objects, referred to herein as "circuit blocks", that have been developed, tested and validated for reuse in multiple designs. Design of an integrated circuit can therefore proceed by assembling multiple circuit blocks together to the extent possible, and then developing any "glue logic" necessary to interface the circuit blocks together into an operative design. The functionality encapsulated within circuit blocks has also increased over time, i.e., from relatively simple circuit blocks that represented simple logical components such as multiplexers and registers, to more complex functional components such as bus interfaces, memory arrays and interfaces, test circuits, etc. Some circuit blocks are also developed to interface over standardized interfaces, thereby further minimizing the amount of additional custom circuitry required to implement such blocks in custom designs.

By utilizing an assemblage of pre-existing circuit blocks, development time can be substantially reduced, as a developer is often required to generate only minimal circuitry that interfaces the pre-existing blocks, rather than recreating the blocks from scratch. A circuit designer is also able to rely on the previous validation and testing performed on a pre-existing block such that testing can occur at more conceptual higher level, to essentially test how the blocks will function when combined together in a design.

A number of software tools, often referred to as "design reuse tools", have been developed to integrate much of the design, testing, validation and synthesis operations into an integrated package that permits a developer to quickly locate suitable circuit blocks, integrate the circuit blocks into an operative design, and synthesize and/or perform testing or validation on the design to create a manufacturable circuit. In addition, some design reuse tools support the use of templates, which function as a form of compilable circuit block that allows a developer to configure higher-level reusable blocks to meet specific needs. Through the use of templates, for example, a user may be permitted to input a few custom parameters for a given block, and have a customized block generated therefrom automatically that meets the specified parameters.

Circuit reuse has also advanced to the point where complete processing units may be defined, validated and tested as self-sufficient "core" blocks that can be combined with interface circuitry and other logic to define a custom processing circuit. Typically, such core blocks support standardized interfaces such as communication busses, such that any circuit block that is capable of interfacing with such a standardized interface can be integrated with the core block with little or no additional circuitry. For digital signal processing applications, for example, DSP core blocks have been developed to provide a programmable digital signal processing infrastructure through which high performance, repetitive and numerically intensive tasks can be performed. DSP core blocks are particularly well suited to design reuse since digital signal processing applications tend to be more application-specific than general purpose microprocessors and other processing circuitry. Specifically, digital signal processing functionality is required in a wide variety of applications, each of which requires different inputs, outputs and other support circuitry. As such, a significant demand exists for integrating DSP core blocks with additional circuitry to develop custom DSP integrated circuit designs. Doing so combines the benefits of a DSP processor, such as programmability, development tools, and software libraries, with the benefits of custom circuits, such as low production costs, small size and lower power consumption.

Development of custom, application-specific DSP integrated circuits is often more expensive and time consuming than for standard, higher volume designs. Application-specific integrated circuits, in particular, are typically produced in lower volumes, and as such, the development costs of such designs are comparatively high. Often, due to greater variability and design, testing and validation of a ASIC design involves more complex test analysis and implementation.

To date, the development of custom, application-specific DSP integrated circuits has had little support in terms of design reuse and automated synthesis, validation and testing. Development time and costs are therefore increased, as is the time to market relative to other types of integrated circuits. Consequently, a significant need continues to exist in the art for greater automation in the design process of custom DSP integrated circuits.

SUMMARY OF THE INVENTION

The invention addresses these and other problems associated with the prior art by providing an apparatus, program product and method for use in automating the design of a custom DSP integrated circuit from a preexisting DSP core block and one or more additional circuit blocks interfaced with the DSP core block. Specifically, an input display is displayed to a user, and utilized to receive user input from the user for use in automatically building a custom DSP integrated circuit. The input display includes at least one selection input component for use in selecting at least one optional circuit block for inclusion in the custom DSP integrated circuit, and at least one configuration input component for use in customizing a customizable circuit block to be included in the custom DSP integrated circuit. The user input received from the user through the input display selects the optional circuit block and customizes the customizable circuit block. Based upon such input, a custom DSP integrated circuit is automatically built by generating a custom circuit block from the customizable circuit block and interfacing the preexisting DSP core block with the optional circuit block and the custom circuit block.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Hardware and Software Environment

Figure 1:
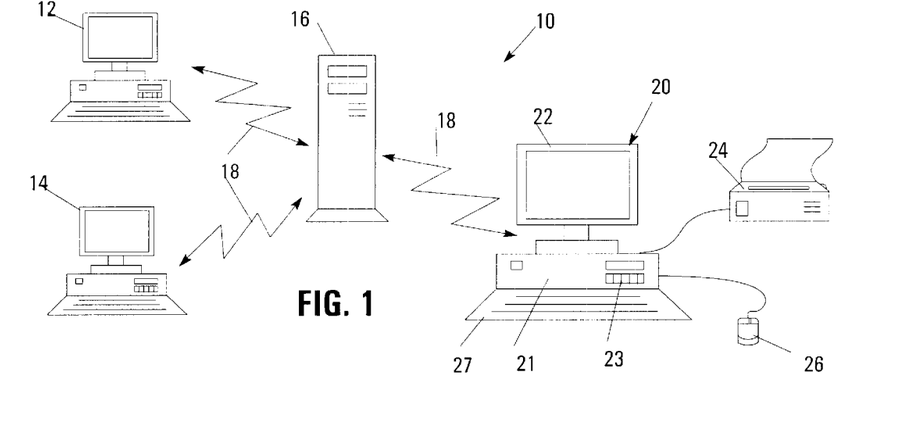
FIG. 1 is a block diagram of a networked computer system for use in performing automated design of a custom DSP integrated circuit consistent with the invention.

Turning to the Drawings, wherein like numbers denote like parts throughout the several views, FIG. 1 illustrates a computer system 10 for use in performing automated design of a custom DSP integrated circuit consistent with the invention. Computer system 10 is illustrated as a networked computer system including one or more client computers 12, 14 and 20 (e.g., desktop or PC-based computers, workstations, etc.) coupled to server 16 (e.g., a PC-based server, a minicomputer, a midrange computer, a mainframe computer, etc.) through a network 18. Network 18 may represent practically any type of networked interconnection, including but not limited to local-area, wide-area, wireless, and public networks (e.g., the Internet). Moreover, any number of computers and other devices may be networked through network 18, e.g., multiple servers.

Client computer 20, which may be similar to computers 12, 14, may include a central processing unit (CPU) 21; a number of peripheral components such as a computer display 22; a storage device 23; a printer 24; and various input devices (e.g., a mouse 26 and keyboard 27), among others. Server computer 16 may be similarly configured, albeit typically with greater processing performance and storage capacity, as is well known in the art.

Figure 2:
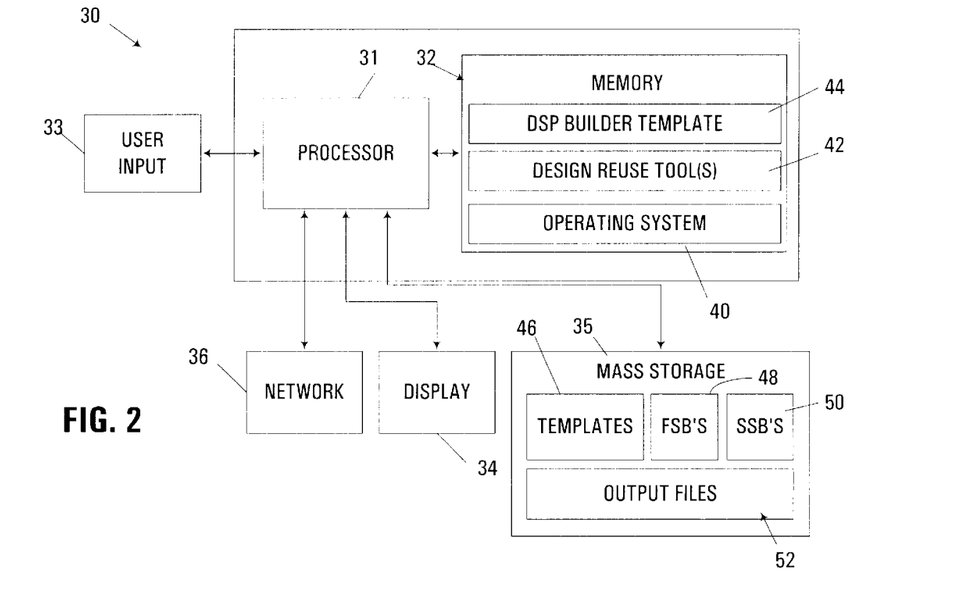
FIG. 2 is a block diagram of an exemplary hardware and software environment for a computer from the networked computer system of FIG. 1, illustrating a DSP builder template for use in performing automated design of a custom DSP integrated circuit consistent with the invention.

FIG. 2 illustrates in another way an exemplary hardware and software environment for an apparatus 30 consistent with the invention. For the purposes of the invention, apparatus 30 may represent practically any type of computer, computer system or other programmable electronic device, including a client computer (e.g., similar to computers 12, 14 and 20 of FIG. 1), a server computer (e.g., similar to server 16 of FIG. 1), a portable computer, a handheld computer, an embedded controller, etc. Apparatus 30 may be coupled in a network as shown in FIG. 1, or may be a stand-alone device in the alternative. Apparatus 30 will hereinafter also be referred to as a "computer", although it should be appreciated the term "apparatus" may also include other suitable programmable electronic devices consistent with the invention.

Computer 30 typically includes at least one processor 31 coupled to a memory 32. Processor 31 may represent one or more processors (e.g., microprocessors), and memory 32 may represent the random access memory (RAM) devices comprising the main storage of computer 30, as well as any supplemental levels of memory, e.g., cache memories, non-volatile or backup memories (e.g., programmable or flash memories), read-only memories, etc. In addition, memory 32 may be considered to include memory storage physically located elsewhere in computer 30, e.g., any cache memory in a processor 31, as well as any storage capacity used as a virtual memory, e.g., as stored on a mass storage device 35 or on another computer coupled to computer 30 via network 36.

Computer 30 also typically receives a number of inputs and outputs for communicating information externally. For interface with a user or operator, computer 30 typically includes one or more user input devices 33 (e.g., a keyboard, a mouse, a trackball, a joystick, a touchpad, and/or a microphone, among others) and a display 34 (e.g., a CRT monitor, an LCD display panel, and/or a speaker, among others).

For additional storage, computer 30 may also include one or more mass storage devices 35, e.g., a floppy or other removable disk drive, a hard disk drive, a direct access storage device (DASD), an optical drive (e.g., a CD drive, a DVD drive, etc.), and/or a tape drive, among others. Furthermore, computer 30 may include an interface with one or more networks 36 (e.g., a LAN, a WAN, a wireless network, and/or the Internet, among others) to permit the communication of information with other computers coupled to the network. It should be appreciated that computer 30 typically includes suitable analog and/or digital interfaces between processor 31 and each of components 32, 33, 34, 35 and 36 as is well known in the art.

Computer 30 operates under the control of an operating system 40, and executes or otherwise relies upon various computer software applications, components, programs, objects, modules, data structures, etc. (e.g., design reuse tool(s) 42 and DSP builder template 44 illustrated as resident in memory 32, and templates 46, digital functional block macros such as FSB blocks 48, analog and/or mixed signal functional block macros such as SSB blocks 50, and output files 52 illustrated as resident in storage device 35, among others). Moreover, various applications, components, programs, objects, modules, etc. may also execute on one or more processors in another computer coupled to computer 30 via a network 36, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions will be referred to herein as "computer programs", or simply "programs". The computer programs typically comprise one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Those skilled in the art will recognize that the exemplary environments illustrated in FIGS. 1 and 2 are not intended to limit the present invention. Indeed, those skilled in the art will recognize that other alternative hardware and/or software environments may be used without departing from the scope of the invention.

DSP Builder Template for Automated Design of Custom DSP Integrated Circuits

The embodiments described hereinafter generally operate by automating the design of a custom DSP integrated circuit through the use of a DSP builder template that operates as a "front end" to a design reuse tool. The template permits both the selection of one or more optional circuit blocks and the customization of one or more customizable circuit blocks to be performed via a user interface. Moreover, once any optional circuit blocks are selected and any customization parameters are selected for a given customizable circuit block, a custom DSP integrated circuit is automatically built by customizing any such customizable block and interfacing a preexisting DSP core block with any selection optional circuit blocks and customized circuit blocks.

In particular, the embodiments described hereinafter are implemented as templates specifically for use with the HDL Integrator design reuse tool available from Philips Semiconductors. The HDL Integrator design reuse tool provides a library of function compilers, FSB macros, SSB macros and templates from which modular integrated circuit components may be assembled, tested, validated and synthesized using a high level user interface. As such, much of the functionality disclosed herein may be implemented through relatively high level function calls to the HDL Integrator tool using the command structure and user interface supported thereby. The use and configuration of templates and other reusable components in an HDL Integrator design reuse tool are also understood in the art, and as such, need not be discussed in further detail herein. Moreover, it will be appreciated by those of ordinary skill in the art having the benefit of the instant disclosure that other electronic design automation (EDA) environments may be utilized to implement the invention in the alternative. Therefore, the invention should not be limited to the particular implementation discussed herein.

In the illustrated embodiment, a template is utilized to perform the automatic integration of the peripherals, processors, memories and custom elements for a desire application around a modular DSP core to reduce the time of design and reduce design errors. In parallel, the design tool provides a synthesizeable netlist of a preliminary configuration. The implementation draws heavily on the reuse of pre-existing blocks of functional components, which are capable of being interfaced with one another via standard interfaces. For a custom DSP integrated circuit, it has been found that a DSP core-based application specific integrated circuit (ASIC) is typically based upon the integration of roughly the same blocks around a DSP core. Typically, the primary blocks include various memories, coders/decoders, serial ports, timers, and other user-defined blocks. The primary differences between each ASIC are typically in the memory configuration and the peripheral address mapping and instances.

In the illustrated implementation, the DSP core is an OAK+DSPCore core, available from DSP Group, Inc., which is a 16-bit fixed point DSP core intended for incorporation into customer-defined ASIC's. The core further includes onchip evaluation, SDI, and boundary scan logic. The core supports 64K×16-bit maximum addressable data space, divided into X and Y data spaces. The Y data space, which is configurable by the user, can occupy the top 2, 4, 8 or 16K of the data space, with the remaining data addresses mapped to the X space. The user can choose how to distribute this space in several blocks of the same or different type in size. RAM and/or ROM can be connected with specific timing options. The program memory space for the core is 16K×16-bit maximum and can be distributed in ROM and/or RAM blocks of different types, speeds and sizes. It will be appreciated that other DSP cores, e.g., the PalmDSPCore core, and other propriety designs, may also be used in the alternative.

Figure 3:
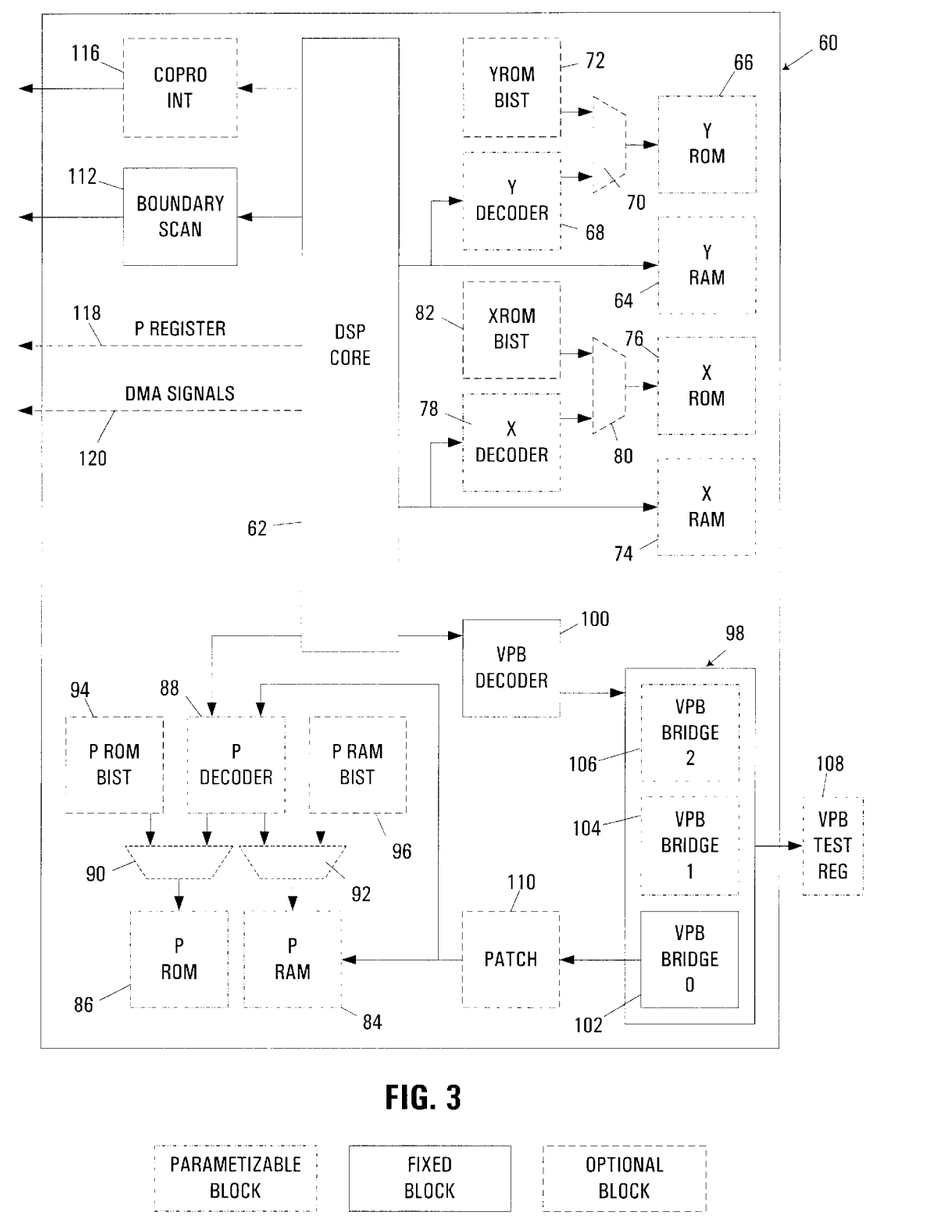
FIG. 3 is a block diagram illustrating various circuit blocks capable of being incorporated into a custom DSP integrated circuit designed using the DSP builder template of FIG. 2.

As illustrated in FIG. 3, the available components that may be incorporated into a custom DSP integrated circuit subsystem consistent with the invention are illustrated at 60, including a modular DSP core 62 such as the OAK+ DSPCore core discussed above. Configurable or parametizable RAM and ROM blocks 64, 66 may be provided for the Y data space, with the ROM 66 coupled to the core via a parametizable decoder 68. Optionally, built in self testing capabilities for the ROM may also be provided, by providing a multiplexer 70 between decoder 68 and ROM 66, and having an additional input coupled to a built in self test (BIST) block 72. A similar configuration of RAM 74, ROM 76, decoder 78, multiplexer 80 and BIST 82 may likewise be provided for the X data space.

For the program data space, program RAM and ROM 84, 86 are provided, with a decoder 88 coupled between the program memory 84, 86 and the DSP core 62. Optional BIST functionality is provided by intermediate multiplexers 90, 92 having additional inputs respectively coupled to BIST engines 94, 96.

The core memory interface includes separate interfaces for program memory and data memory, with separate buses and controls for each memory space. The transactions can be of READ type or WRITE type for both data and program memories. Moreover, slow memory transactions may be supported using a wait state mechanism.

Lower speed and non-bus-mastering peripherals can be connected to the DSP core via a peripheral bus bridge 98 coupled to core 62 via a decoder 100. In the illustrated implementation, a standardized VLSI peripheral bus (VPB) known in the art may be utilized as the lower speed peripheral bus. Bridge 98 includes up to three instances 102, 104 and 106 of a three-cycle unidirectional ODB to VPB bridge block to be included in the DSP subsystem. A VPB test register 108 is also typically generated to assist in testing the operation of the bridges during design and verification. Each bridge utilizes a three VPB clock cycle architecture, with the unidirectional DSP and VPB buses.

An optional patch block may be included to provide software fixes of a DSP ROM program. Patch 110 typically provides up to eight source address vectors and up to eight destination address vectors to change the normal flow of a ROM program. The configuration registers are accessible through a VPB interface in bridge 102. The patch block reads the instruction address, and whenever the address matches the address of a source address vector, the patch disables the program memory blocks, except the block which contains the patch code, from driving the program data bus. the patch block also drives the hard-coded branch OP-code residing in the patch block on the bus. Then, the vector destination is driven on the bus by the patch block, such that the patch routine is executed by the DSP core. The configuration registers for patch block 110 are typically accessed via bridge block 102.

Boundary scan logic 112 is also provided coupled to the DSP core to provide a mechanism for inputting and outputting scan data during in built in self test. The user typically has the option of selecting between a "state-machine driven" and a "core-driven memory test strategy", with the "state-machine driven" option resulting in the generation of BIST engines 72, 82 and 94–96 as described above. In addition, it may be desirable to provide an optional coprocessor interface block 116, to permit various coprocessors, e.g., the NLMS or VITERBI coprocessors (among others), to the DSP core for additional functionality. The data transfers are typically done with the DSP core user-defined registers, so in many instances, glue logic is required to control the READ and WRITE accesses.

Also optionally provided are P register signals 118 output from DSP core block 62, which are specific to the Oak+ DSPCore core, and represent the output of a P register in the core that is used by some coprocessors such as the NLMS coprocessor. DMA signals 120 are also optionally provided to allow a designer to bring the relevant DMA control signals to the DSP subsystem boundary for implementation of DMA functionality external to the subsystem.

It will be appreciated that each of the blocks illustrated in FIG. 3 may be selected from available modular blocks known in the art, or may be implemented using other propriety designs.

Figure 4:
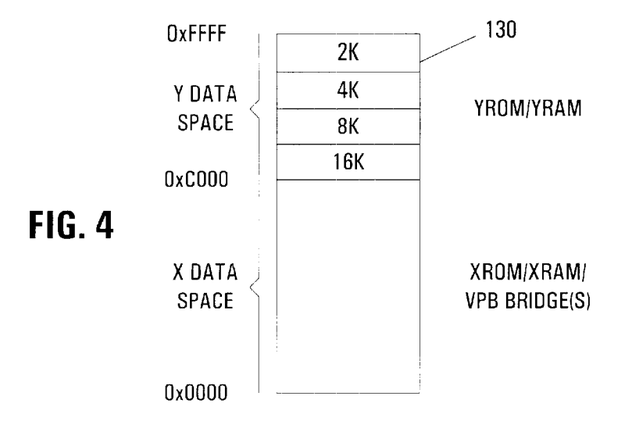
FIG. 4 is a block diagram of a memory address space capable of being used in a custom DSP integrated circuit designed using the DSP builder template of FIG. 2.

FIG. 4 next illustrates a memory architecture 130 suitable for use with DSP core block 62, wherein a Y data space may be selected among the 2K, 4K, 8K and 16K highest memory addresses in the data space, with the remaining addresses mapped into the X space.

Figure 5:
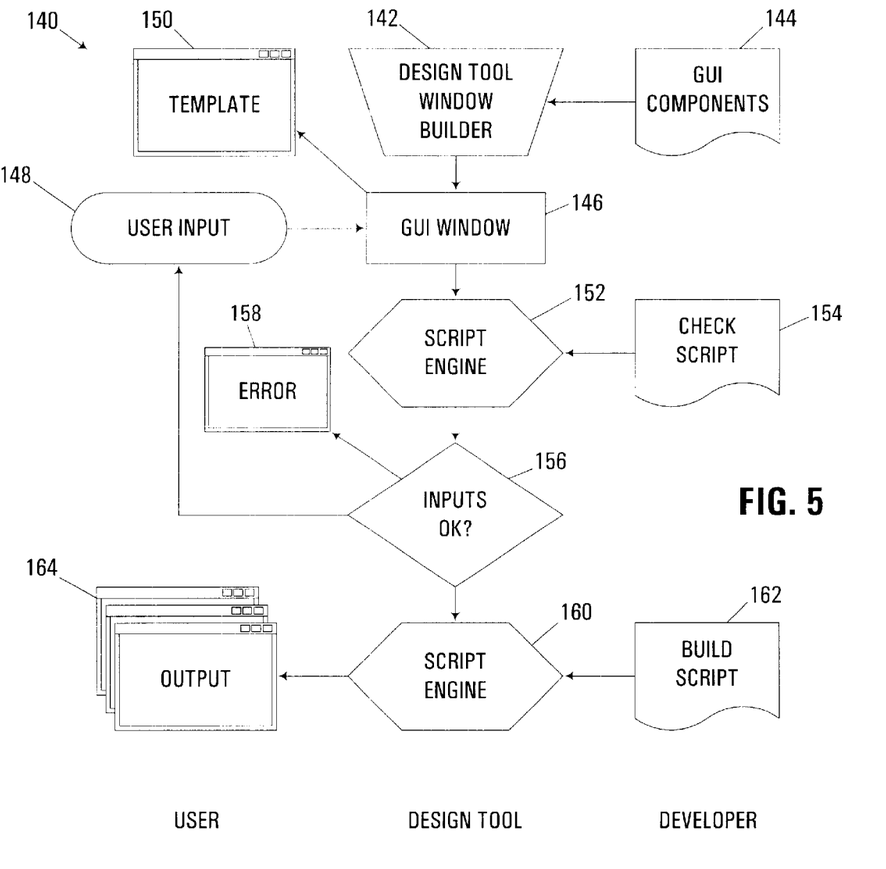
FIG. 5 is a flowchart illustrating the sequence of operations utilized in designing a custom DSP integrated circuit using the DSP builder template of FIG. 2.

FIG. 5 next illustrates the usage of a DSP builder template to automate the development of a custom DSP integrated circuit consistent with the invention. The sequence of operations illustrated in FIG. 5 at 140 may be utilized to generate custom DSP integrated circuits using a DSP Builder template in the manner discussed herein. The DSP Builder template is represented in the HDL Integrator environment by a collection of GUI components, check scripts and build scripts.

The overall process begins as illustrated in block 142 by constructing one or more graphical user interface windows via the design tool window builder. Input to the design tool window builder is a series of GUI components 144 developed by a developer and utilized to received user input for interacting with the template. The output of builder 142 is one or more GUI windows 146, which are configured to receive user input as illustrated at 148 as a user interacts with the window to define one or more parameters for use in generating a custom DSP integrated circuit consistent with the invention. One suitable template window is illustrated at 150. Once a user has provided input to the GUI window, the user initiates generation of the integrated circuit design via selection of a compile option from the GUI window, resulting in the execution of a script engine 152 in the HDL Integrator tool that processes a check script 154 developed by a developer, and used to verify the parameters input by a user. In particular, the check script essentially is processed by the script engine to analyze the user options and verify that such options are consistent with the available options for the DSP subsystem. Based upon the output of the script engine, it is determined whether the inputs provided by the user are acceptable. If any errors are detected, an error window is displayed at 158, and control returns to block 148 to receive modified input from the user to correct any errors in the inputs previously provided thereby. If the inputs are acceptable, control passes to block 160 to execute the script engine once again to process a build script 162 that processes the parameters to output one or more output files 164 representing the output of the template. Utilizing the HDL Integrator tool described above, the GUI components file 144 is in the format of a ".TPL" or ".STPL" file as processed by the design reuse tool to generate a graphical interface window and any required subwindows. Check script file 154 is in the format of an ".HPC" file that contains the code to check all of the user inputs and generate any error or other warning messages. The build script file 162 is in the format of an ".HTF" file functioning as the generic scripts that generate the VHDL, VERILOG or other high definition language files with the parameters that have been specified by the user in the template window. It will be appreciated, however, that in other environments, alternate source files may be utilized to control a design reuse tool in the manner described herein.

While other combinations of parameters may be utilized consistent with the invention, in the illustrated embodiment, the following options are provided for generating a custom DSP integrated circuit from the DSP subsystem described above:

TABLE I

DSP BUILDER OPTIONS

Y Space Size (2 K, 4 K, 8 K or 16 K)
Data Y ROM Start Address
Data Y ROM Size (0–16384 words)
Y ROM Block:
   Data ROM Size (512–4096 words)
Y RAM Type (HDIRAM or OAK + RAM)
Data Y RAM Start Address
Data Y RAM Size (0–16384 words)
Y RAM Block:
   Data RAM Size (1024–4096 words for
   OAK + RAM/1024–16384 for HDIRAM)
Data X ROM Start Address
Data X ROM Size (0–63487, 61439, 57343 or 49151 words)
X ROM Block:
   Data ROM Size (512–4096 words)
X RAM Type (HDIRAM or OAK + RAM)
Data X RAM Start Address
Data X RAM Size (0–63487, 61439, 57343 or 49151 words)
X RAM Block:
   Data RAM Size (1024–4096 words for
   OAK + RAM/1024–32768 words for HDIRAM)
Data P ROM Start Address
Data P ROM Size (0–65536 words)
P ROM Block:
   Data RAM Size (512–4096 words)
Data P RAM Start Address
Data P RAM Size (0–65536 words)
P RAM Block:
   Program RAM Size (1024–32768 words)
Patch Option (No or Yes)
   OAK DPRAM Base
   OAK DPRAM Size
Coprocessors:
   Coprocessor (No or Yes)
   Output P Register (No or Yes)
VPB Definition (ODB2VPB Template)
DMA Option (No or Yes)

Figure 6:
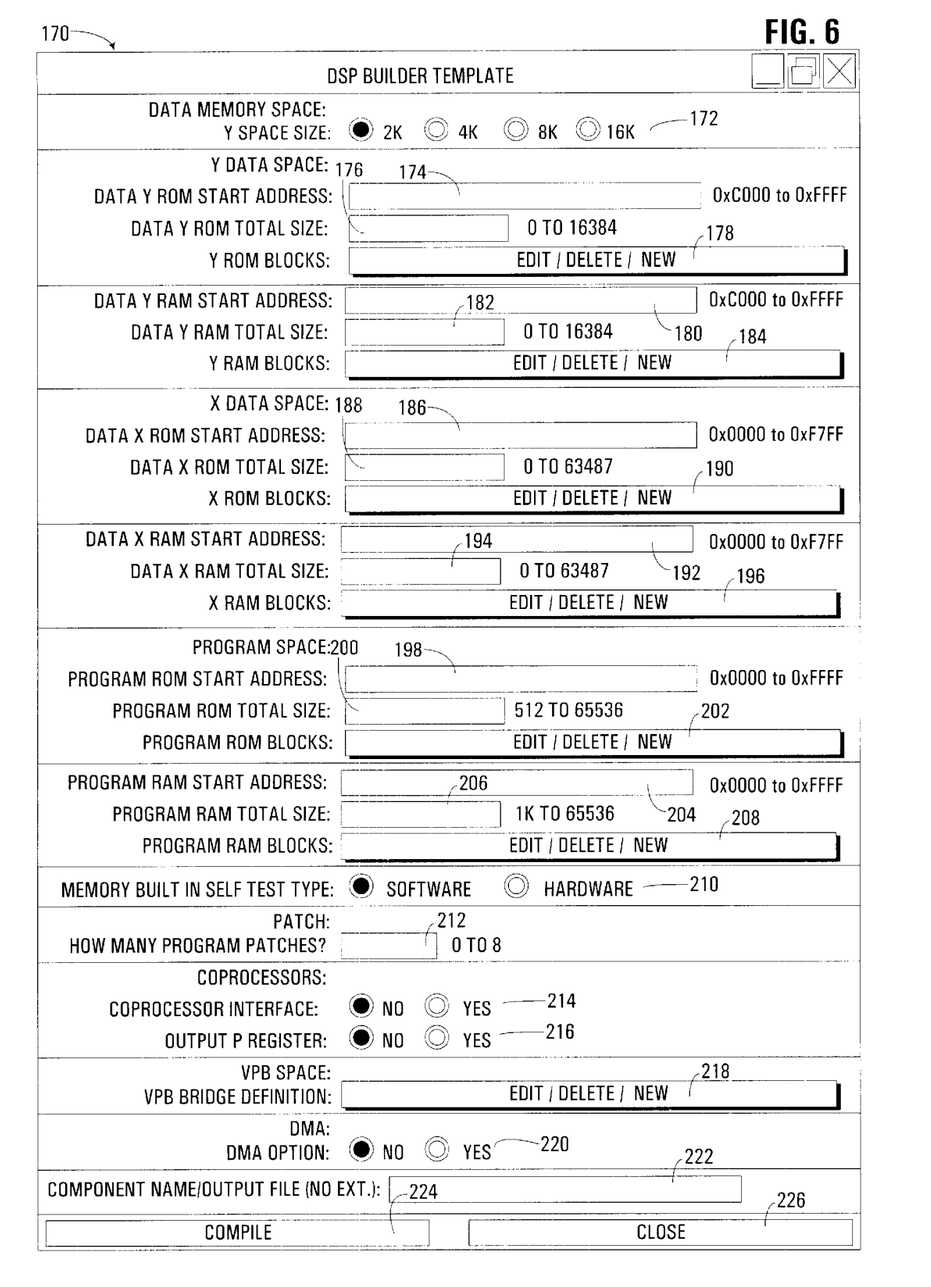
FIG. 6 is a block diagram of a representative graphical user interface used by the DSP builder template of FIG. 2.

FIG. 6 illustrates, for example, a DSP builder template window 170 through which user input may be received in generating a custom DSP integrated circuit from the template discussed above. As shown at 172, a user may be permitted to select one of four available Y memory space sizes of 2K, 4K, 8K or 16K, with the assumption being that the remainder of the 64K data space is allocated to the X data space. For the Y data space, an input field 174 receives the data Y ROM start address, and a data Y ROM total size is input via a field 176. In addition, through selection of a button 178, a user is permitted to select the types of modular components to be used to implement the Y ROM blocks. Typically, selection of button 178 opens a subwindow through which a user may select various types of modular memory blocks and customize such blocks as desired. In the alternative, only one type of Y ROM block may be supported, whereby button 178 would not be required.

Similar to the Y ROM information, fields 180, 182 and button 184 are used to respectively receive input for the start address, total size and components used to implement the Y RAM. In addition, fields 186, 188, 192 and 194, and buttons 190 and 196, provide like information for the X data space ROM and RAM's. Fields 198, 200, 204 and 206, and buttons 202 and 208, likewise provide start address, total size and component type selections for the program space ROM and RAM.

In addition, at 210, a user is permitted to select the type of built in self test to be implemented in the system, relying either on software, whereby the DSP core executes a software program to perform the testing, or hardware, where additional BIST engine blocks (i.e., BIST blocks 72, 82, 94 and 96 of FIG. 3) are added to the custom design.

Field 212 enables a user to select the number of program patches required to be implemented within the optional patch block. Inputs 214 and 216 determine respectively whether the coprocessor interface block should be included, and whether the P register outputs should be included.

Button 218 enables a user to select the definition of the external peripheral bus, e.g., to select different bridge options or modular components to be used to implement the same. Inputs 220 enable a user to select whether or not to provide external DMA signals, while field 222 receives a component name to be used as the identifier for the generated custom integrated circuit. It is the component name that is used to generate the primary identifier for the output files generated by the template, with such output files being distinguished by various extensions suitable for the types of files.

Execution of the template is initiated via a compile button 224, and a CANCEL option is provided by a close button 226.

Returning to FIG. 5, the generation of output files 164 in response to execution of a build script 162 may be implemented in a number of manners in different environments. For example, it may be desirable to utilize the parameters input by a user to write the RTL description of the coding logic and create a secondary script file that calls a memory design tool, such as the Memory Integrator tool from Philips Semiconductor, that generates models for a memory compiler that generates customized memory components suitable for interfacing within a custom DSP integrated circuit. A user may also be permitted to select addresses for the peripherals to be interfaced with the DSP subsystem, with script files generated to call bridge templates to provide start addresses, latches, device definitions, and other bridge specifics in a manner known in the art. It will be appreciated that the scripts utilize a combination of instantiating required or optional components, executing templates or macros, and other automated design functionality known in the art. Further, implementing such functionality in HDL Integrator scripts would be within the abilities of one of ordinary skill in the art having the benefit of the instant disclosure.

Generated as output of the template may be one or more of RTL (register transfer language) files, including decode logic such as a data space decoder, an X decoder, a Y decoder, a program space decoder, a VPB bridges decoder, a coprocessor interface, and an overall DSP subsystem file that instantiates all subsystem blocks and contains the required latches and tri-states to correctly connect the blocks. It may also be desirable to generate test bench files suitable for verifying the option of the subsystem through the VPB register. The test bench file may contain simple clock and phase generators, the VPB registers in the top subsystem module and interconnects therebetween.

The template may also generate one or more script files, including HDLI scripts utilized to extract instantiated blocks from the design reuse tool database, including, for example, the DSP to VPB bridges and the patch block, if included. In addition, scripts for running the Memory Integrator tool, as well as compilation and simulation scripts, may be generated to simulate the subsystem. Typically, such scripts call a simulator such as the ModelSim simulator available from Mentor Graphics, which is used to verify the correctness of the overall design. In addition, synthesis script files may also be generated to synthesize the individual blocks and the subsystem hierarchy for use in verifying that all of the generated RTL block are synthesizeable.

Moreover, given that the DSP core is capable of executing software, it may also be desirable to generate assembler source code files to validate the chosen system configuration. As assembly file may be generated to write and/or read all of the memory blocks, coprocessor and peripheral registers to verify the proper operation of the core in the custom DSP integrated circuits. A set of generic assembler files are typically provided by a modular DSP core, which files may be customized based upon the user input parameters in a conventional manner to generate a customized assembler file suitable for testing the custom DSP integrated circuit. In addition, suitable linker script files may also be provided and executed on an appropriate assembler and linker to generate assembly code to be programmed into a program ROM for execution during simulation.

Figure 7:
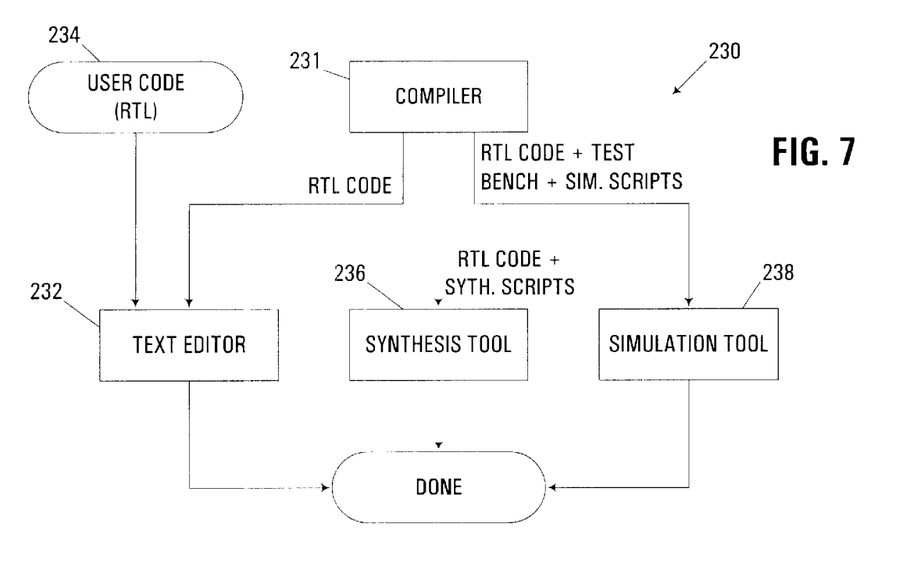
FIG. 7 is a flowchart illustrating the routing of output files generated by the DSP builder template of FIG. 2.

FIG. 7, for example, illustrates the primary types of files that may be generated by the compilation of the template (represented by compiler block 231). Specifically, RTL code may be provided to a text editor 232, which receives additional user code in RTL format as illustrated at block 234 to further refine the custom design. In addition, RTL code plus suitable synthesis scripts are generated and forwarded to a synthesis tool 236 to perform synthesis of physical designs from the hardware description representations of the design. Moreover, RTL code, test bench script and simulator scripts are generated and forwarded to a simulator 238 for performing testing and verification of the design. It will be appreciated that various output files may be omitted, or additional output files may be utilized in different environments. Therefore, the invention is not limited to the particular set of output files illustrated herein.

It will be appreciated that the implementation of the functionality of the DSP template described herein would be well within the ability of one of ordinary skill in the art having the benefit of the instant disclosure.

It will also be appreciated that other core designs, e.g., the PalmDSPCore core and other general purpose DSP cores may also be used in the alternative. Other modifications will be apparent to one of ordinary skill in the art.

A primary benefit of the system described herein is that development time is substantially reduced compared to conventional specific DSP subsystem design processes. Through the selection of only a few customizable parameters, a full design, complete with both generation script files and testing and verification script files, may be generated and utilized in validation of a created design. With only a few parameters available to the user, checking of the consistency of such parameters prior to compilation may be performed to further limit the possibility of design mistakes, and thereby generating a more reliable design in relatively time and effort.

Other modifications and features will be apparent to one of ordinary skill in the art. Therefore, the invention lies in the claims hereinafter appended.

What is claimed is:

1. A method of designing a custom digital signal processing (DSP) integrated circuit, the method comprising:

(a) displaying an input display to a user, the input display including at least one selection input component for use in selecting at least one optional circuit block for inclusion in the custom DSP integrated circuit, and at least one configuration input component for use in customizing a customizable circuit block to be included in the custom DSP integrated circuit;

(b) receiving user input from the user using the input display that selects the optional circuit block and customizes the customizable circuit block; and (c) automatically building the custom DSP integrated circuit based upon the user input by generating a custom circuit block from the customizable circuit block based upon the user input and interfacing a preexisting DSP core block with the optional circuit block and the custom circuit block.

2. The method of claim 1, wherein automatically building the custom DSP integrated circuit includes generating at least one hardware description file that defines the custom DSP integrated circuit.

3. The method of claim 2, wherein generating at least one hardware description file that defines the custom DSP integrated circuit includes generating hardware description information for decoding logic used to interface the DSP core block with the optional circuit block.

4. The method of claim 2, wherein automatically building the custom DSP integrated circuit further includes generating an assembler test file for the custom DSP integrated circuit.

5. The method of claim 4, further comprising compiling the assembler test file and validating the custom DSP integrated circuit using the compiled assembler test file.

6. The method of claim 2, wherein automatically building the custom DSP integrated circuit further includes generating at least one synthesis script file.

7. The method of claim 6, further comprising synthesizing the custom DSP integrated circuit by executing the synthesis script file.

8. The method of claim 2, wherein automatically building the custom DSP integrated circuit further includes generating at least one simulation script file.

9. The method of claim 8, further comprising running a simulation on the custom DSP integrated circuit by executing the simulation script file.

10. The method of claim 2, wherein generating the custom circuit block from the customizable circuit block includes generating at least one memory integration script file and executing the integration script file to generate a custom memory block for the custom DSP integrated circuit.

11. The method of claim 1, wherein the optional block comprises a patch block configured to provide at least one software fix of a program to be executed on the custom DSP integrated circuit.

12. The method of claim 1, wherein the optional block comprises a built-in-self test (BIST) block.

13. The method of claim 1, wherein the optional block comprises a coprocessor interface block.

14. The method of claim 1, wherein the customizable block is selected from a group consisting of a random access memory (RAM) block, a read only memory (ROM) block and an external bus interface block.

15. The method of claim 1, wherein the preexisting DSP core block includes X Data, Y Data and Program interfaces, and wherein automatically building the custom DSP integrated circuit includes interfacing the DSP core block with an X Data memory block, a Y Data memory block and a Program memory block via the respective X Data, Y Data and Program interfaces.

16. The method of claim 1, wherein displaying the input display to the user, receiving the user input from the user, and automatically building the custom DSP integrated circuit are performed by executing at least one script on a design tool.

17. An apparatus, comprising:
(a) a memory having resident therein a preexisting DSP core block, and an optional circuit block and a customizable circuit block suitable for interfacing with the DSP core block; and
(b) a program resident in the memory, the program configured to display an input display to a user that includes at least one selection input component for use in selecting the optional circuit block and at least one configuration input component for use in customizing the customizable circuit block, receive user input from the user using the input display that selects the optional circuit block and customizes the customizable circuit block, and automatically build the custom DSP integrated circuit based upon the user input by generating a custom circuit block from the customizable circuit block based upon the user input and interfacing the preexisting DSP core block with the optional circuit block and the custom circuit block.

18. The apparatus of claim 17, further comprising a design tool, wherein the program comprises at least one script executable on the design tool.

19. A program product, comprising:
(a) a program resident in the memory, the program configured to display an input display to a user that includes at least one selection input component for use in selecting at least one optional circuit block for inclusion in the custom DSP integrated circuit and at least one configuration input component for use in customizing a customizable circuit block to be included in the custom DSP integrated circuit, receive user input from the user using the input display that selects the optional circuit block and customizes the customizable circuit block, and automatically build the custom DSP integrated circuit based upon the user input by generating a custom circuit block from the customizable circuit block based upon the user input and interfacing a preexisting DSP core block with the optional circuit block and the custom circuit block; and
(b) a signal bearing medium bearing the program.

20. The program product of claim 19, wherein the program comprises at least one script executable on a design tool.

21. The program product of claim 19, wherein the signal bearing medium includes at least one of a recordable medium and a transmission medium.

* * * * *